(12) United States Patent
Otsuka et al.

(10) Patent No.: US 7,700,477 B2
(45) Date of Patent: Apr. 20, 2010

(54) METHOD FOR FABRICATING SEMICONDUCTOR DEVICE

(75) Inventors: Hideki Otsuka, Toyama (JP); Norishige Aoki, Kyoto (JP); Shinichi Imai, Osaka (JP)

(73) Assignee: Panasonic Corporation, Osaka (JP)

( * ) Notice: Subject to any disclaimer, the term of this patent is extended or adjusted under 35 U.S.C. 154(b) by 429 days.

(21) Appl. No.: 11/061,625

(22) Filed: Feb. 22, 2005

(65) Prior Publication Data

US 2005/0186794 A1    Aug. 25, 2005

(30) Foreign Application Priority Data

Feb. 24, 2004  (JP)  ............ 2004-047284
Apr. 16, 2004  (JP)  ............ 2004-121582

(51) Int. Cl.
*H01L 21/4763*    (2006.01)
*H01L 21/44*       (2006.01)
*H01L 21/302*     (2006.01)

(52) U.S. Cl. ............... 438/622; 438/626; 438/672; 438/687; 438/692

(58) Field of Classification Search .......... 438/622, 438/626, 672, 675, 687, 692
See application file for complete search history.

(56) References Cited

U.S. PATENT DOCUMENTS

| | | | | |
|---|---|---|---|---|
| 5,904,557 | A * | 5/1999 | Komiya et al. .......... 438/633 |
| 6,030,895 | A * | 2/2000 | Joshi et al. ............. 438/679 |
| 6,068,879 | A * | 5/2000 | Pasch .................... 216/18 |
| 6,274,478 | B1 * | 8/2001 | Farkas et al. ........... 438/626 |
| 6,350,687 | B1 * | 2/2002 | Avanzino et al. ........ 438/687 |
| 6,797,609 | B2 * | 9/2004 | Noguchi et al. ........ 438/627 |
| 6,890,846 | B2 * | 5/2005 | Noguchi ................. 438/622 |
| 7,144,802 | B2 * | 12/2006 | Xia et al. ................ 438/618 |
| 7,201,784 | B2 * | 4/2007 | Miller et al. ............. 51/308 |
| 2001/0030315 | A1 * | 10/2001 | Aoki et al. .............. 252/390 |
| 2002/0084456 | A1 * | 7/2002 | Sugihara et al. .......... 257/48 |
| 2002/0160103 | A1 * | 10/2002 | Fukunaga et al. ........ 427/125 |
| 2003/0068888 | A1 * | 4/2003 | Kodera et al. .......... 438/687 |
| 2003/0087513 | A1 * | 5/2003 | Noguchi et al. ........ 438/627 |
| 2003/0162399 | A1 * | 8/2003 | Singh .................... 438/692 |
| 2004/0130030 | A1 * | 7/2004 | Kunimune et al. ...... 257/758 |

(Continued)

FOREIGN PATENT DOCUMENTS

JP    2000-36477    2/2000

(Continued)

OTHER PUBLICATIONS

Japanese Office Action Issued in corresponding Japanese Patent Application No. JP 2005-037794, dated Feb. 6, 2007.

*Primary Examiner*—Matthew C Landau
*Assistant Examiner*—James M Mitchell
(74) *Attorney, Agent, or Firm*—McDermott Will & Emery LLP

(57) ABSTRACT

In a method for fabricating a semiconductor device, interconnect grooves are formed in an insulating film on a substrate, and then a copper film is formed on the insulating film to fill the interconnect grooves. Subsequently, portions of the copper film existing outside the interconnect grooves are polished to form interconnects, and then a cleaning process is performed on the resulting substrate. Thereafter, moisture remaining around a portion of the insulating film exposed between the interconnects is removed in a vacuum.

7 Claims, 8 Drawing Sheets

U.S. PATENT DOCUMENTS

| | | | |
|---|---|---|---|
| 2004/0152256 A1* | 8/2004 | Noguchi et al. | 438/250 |
| 2004/0152298 A1* | 8/2004 | Ohashi et al. | 438/633 |
| 2004/0219298 A1* | 11/2004 | Fukunaga et al. | 427/304 |
| 2004/0259352 A1* | 12/2004 | Leng et al. | 438/687 |
| 2004/0266183 A1* | 12/2004 | Miller et al. | 438/687 |
| 2005/0158999 A1* | 7/2005 | Lin et al. | 438/687 |

FOREIGN PATENT DOCUMENTS

| | | |
|---|---|---|
| JP | 2001-085522 | 3/2001 |
| JP | 2001-196379 | 7/2001 |
| JP | 2003-51481 | 2/2003 |

* cited by examiner

METHOD FOR FABRICATING SEMICONDUCTOR DEVICE

CROSS-REFERENCE TO RELATED APPLICATIONS

This application claims priority under 35 U.S.C. §119 on Patent Applications No. 2004-047284 filed in Japan on Feb. 24, 2004, and No. 2004-121582 filed in Japan on Apr. 16, 2004, the entire contents of which are hereby incorporated by reference.

BACKGROUND OF THE INVENTION (a) Fields of the Invention

The present invention relates to a semiconductor device fabrication method and particularly relates to a copper interconnect formation step included in a fabrication process of a semiconductor device.

(b) Description of Related Art

In recent years, semiconductor products made of silicon have become finer and more sophisticated. Accompanied with this trend, the semiconductor products make heavy use of copper interconnects. However, it is extremely difficult to subject copper to dry etching. Therefore, the following method for forming a copper interconnect (damascene technique) is typically employed which includes a series of steps of: forming an interconnect groove by dry etching of an insulating film; forming a barrier film in the formed interconnect groove by sputtering technique and then filling the groove with copper by electrolysis plating; and removing excess-barrier and copper films present outside the interconnect groove and planarizing the surface by chemical mechanical polishing.

In the above-described step of performing chemical mechanical polishing in the damascene technique, after the copper and barrier films are subjected to chemical mechanical polishing, a cleaning process is performed for removing particles such as abrasive and metal contaminants remaining on a substrate surface, and then a drying process is performed on the substrate. A currently dominant system for such a procedure is a so-called dry-in, dry-out system in which a series of processes of chemical mechanical polishing, cleaning, and drying is carried out within the same apparatus, and apparatuses operating in this system go mainstream. An exemplary chemical mechanical polishing apparatus capable of carrying out this through process is proposed in Japanese Unexamined Patent Publication No. 2000-36477. The proposed apparatus carrying out a through process of polishing, cleaning, and drying is characterized in that in order to keep the cleanliness of a cleaning and drying unit, a water flow separates an atmosphere in a polishing unit from an atmosphere in the cleaning and drying unit. Also, for example, Japanese Unexamined Patent Publication No. 2003-51481 proposes an apparatus characterized in that in order to enhance the throughput of a chemical mechanical polishing apparatus, two or more drying rooms are provided in the subsequent stage of a cleaning process unit to allow a parallel drying process. These conventional apparatuses carrying out a through process employ, as a drying mechanism, spin drying technique, dry gas blowing technique, lamp heating technique, or IPA drying technique.

Recently, a problem has arisen that moisture still remaining on the substrate after the polishing and clearing processes described above affects the reliability of a copper interconnect. Specifically, in the case where there is moisture on the surface of a portion of an insulating film provided between copper interconnects after chemical mechanical polishing, if the substrate in this state is let to stand for more than a given period of time until the next process is conducted thereon, part of copper constituting the interconnect migrates (moves) due to that moisture. This results in creation of a thin copper layer on the insulating film. The thin copper layer thus created grows by a current flowing through the interconnects during operation of the semiconductor device. If the growing copper finally reaches the adjacent interconnect, a short circuit may be made between the interconnects.

FIGS. 7A to 7D are plan views for illustrating the mechanism of occurrence of failure causing the short circuit between the interconnects mentioned above. Note that FIGS. 7A to 7D show copper interconnects 101 provided with barrier films formed in interlayer insulating films 100, and also show the state in which moisture remains in a portion of the interlayer insulating film 100 positioned between the copper interconnects 101.

As shown in FIGS. 7A to 7D, the moisture 102 remaining in the portion of the interlayer insulating film 100 positioned between the copper interconnects 101 causes migration 103 of copper constituting the interconnects 101 (see FIG. 7B). When this migration is developed (see FIG. 7C), a short circuit failure 104 between the interconnects will finally arise (see FIG. 7D). Such an occurrence of short circuit failure between the interconnects may in turn cause defects of the fabricated semiconductor product, so that this is a big problem for the reliability of the semiconductor product. Therefore, it is important to sufficiently remove the moisture remaining on the substrate after chemical mechanical polishing.

After the chemical mechanical polishing is performed in the damascene technique mentioned above, as shown in a plan view of FIG. 8A and a sectional view of FIG. 8B, defects 202 caused by copper corrosion are likely to be created on the surface of the copper interconnect 201 provided with the barrier films formed in the interlayer insulating film 200 on the substrate. Thus, since the copper corrosion defects 202 are likely to be created on the surface of the copper interconnect 201 formed in the interlayer insulating film 200, a treatment for preventing the surface of the copper interconnect 201 from corroding is required by the time a film formation step is implemented as the next process step. Generally, the treatment for preventing this corrosion is performed in such a manner that an anticorrosive is added to an abrasive used for chemical mechanical polishing of the barrier film to subject the surfaces of the copper interconnects to anticorrosive treatment during the chemical mechanical polishing of the barrier film. As the anticorrosive, use is made of triazole-based compounds, their derivatives, or water-soluble agent containing their mixture. Among them, the most commonly used anticorrosive is benzotriazole (BTA). BTA reacts with copper to produce a stable compound, Cu—BTA, and the produced Cu—BTA is used as a coating to prevent corrosion of the copper interconnect. In addition, Japanese Unexamined Patent Publication No.2001-196379 proposes a method which includes the step of applying, to a substrate, a solution with not an abrasive but an anticorrosive contained therein to form an anticorrosive layer after or during chemical mechanical polishing.

SUMMARY OF THE INVENTION

First, the above-described problem resulting from moisture remaining on the surface of the portion of the insulating film positioned between the copper interconnects cannot be solved even by any conventional drying methods employing spin drying technique, dry gas blowing technique, lamp heating technique, IPA drying technique, or the like. To be more specific, first, in the case of employing spin drying technique or dry gas blowing technique, since the interlayer insulating film exposed at the substrate surface is hygroscopic, it is impossible to sufficiently remove absorbed moisture within a short time. Second, in the case of employing lamp heating technique, heating promotes migration of copper constituting the interconnect. Therefore, this technique cannot be employed. Third, in the case of employing IPA drying technique, after the drying, organic components in trace amounts may remain on the substrate to adversely affect the characteristics of the interconnect via. Therefore, this technique cannot be employed as well. Furthermore, with future miniaturization of the devices, low-dielectric-constant films having higher hygroscopicity will be used as their interlayer insulating films. Therefore, even though any of the drying techniques shown above is employed, a sufficient removal of moisture still remaining after chemical mechanical polishing becomes increasingly difficult.

For example, spin drying technique that is currently the mainstream of the drying technique after cleaning was used to perform a drying process on a substrate, and then the reliability of interconnects on the substrate was evaluated. In this case, an exemplary result of the evaluation will be described below. Note that the reliability evaluation is made from the number of chips having caused defects in the case where using a TEG exclusively for the evaluation of the interconnect reliability, the reliability test was conducted at high temperatures for 36 hours under the condition of 125° C./2 V. The number of chips to be evaluated is 576 per slice.

The reliability evaluation method described above was practiced on the substrates which were let to stand for 1 and 24 hours, respectively, after the drying process was conducted by the spin drying technique and until the next process step is carried out. As a result of this, in the case where the period of time for which the substrate was let to stand was 1 hour, the number of chips having caused defects was one. On the other hand, in the case where the period of time for which the substrate was let to stand was 24 hour, the number of chips having caused defects was eight. Typically, in this evaluation, the criterion of acceptable reliability is that the number of chips having caused defects is three or smaller. Thus, when the substrate subjected to the drying process by the spin drying technique was let to stand for 24 hours until the next step is carried out, the result was obtained that the reliability of the interconnect was greatly degraded. As is apparent from the above, the apparatus using the conventional drying technique cannot sufficiently remove moisture remaining on the substrate after chemical mechanical polishing, so that copper migration occurs due to the remaining moisture. This is a big problem for the reliability of the copper interconnect.

Second, the conventional method for forming an anticorrosive coating on the surface of the copper interconnect by adding an anticorrosive during the barrier film polishing or by applying a solution containing an anticorrosive after the polishing causes a problem that the anticorrosive coating cannot be formed uniformly on the substrate. The reason for this ununiform formation of the anticorrosive coating is probably that the concentration of the anticorrosive contained in the polishing solution applied on the substrate is not uniform over the substrate surface during the barrier film polishing. Also, even if the step of applying a solution containing not an abrasive but an anticorrosive is conducted after the barrier film polishing, it is difficult to form a clean anticorrosive coating uniformly on the surface of the copper interconnect because residual polishing solution and polishing wastes remaining after the barrier film polishing are not removed completely. Furthermore, the fact that the anticorrosive coating formed during the barrier film polishing is partly removed by cleaning with alkali and acid and cleaning with pure water in the substrate cleaning process after the polishing is also considered as an additional factor which prevents a uniform anticorrosive coating from being formed on the surface of the copper interconnect.

For the purpose of checking whether or not an anticorrosive coating is formed uniformly on the surface of the copper interconnect, a polishing process was carried out by the conventional method in which an additive is added to the abrasive for the barrier film, and then the polished substrate was let to stand in the air for three days. After this procedure, the resulting substrate surface was inspected using an optical defect inspection tool. As a result of this, more than a thousand corrosion defects above described as shown in FIGS. 8A and 8B were detected on the copper interconnect. The reason why these corrosion defects were created is probably that as mentioned above, the anticorrosive coating is formed only partly, not fully, on the copper interconnect. Such corrosion defects would cause breaks in the copper interconnects, which is a big problem for the reliability of the semiconductor product. However, as described above, it is difficult for the conventional method to form a clean anticorrosive coating uniformly on the surface of the copper interconnect.

With the foregoing in mind, the present invention is intended to be able to solve all of the above problems, and its object is to remove moisture still remaining on a substrate after chemical mechanical polishing on a copper film, and to form a clean anticorrosive coating uniformly on a copper interconnect.

To attain the above objects, a method for fabricating a semiconductor device according to the present invention is characterized by including the steps of: forming interconnect grooves in an insulating film on a substrate; forming a copper film on the insulating film to fill the interconnect grooves; polishing portions of the copper film existing outside the interconnect grooves to form interconnects; performing a cleaning process on the substrate having been formed with the interconnects; and removing, after the cleaning process, moisture remaining around a portion of the insulating film exposed between the interconnects.

With the method for fabricating a semiconductor device according to the present invention, the copper film is polished to form the interconnects, a cleaning process is performed, and then moisture still remaining around a portion of the insulating film exposed between the interconnects is removed. Therefore, copper migration onto the insulating film can be hampered which is caused by moisture remaining on the insulating film after the polishing. This prevents the occurrence of a short circuit between the interconnects, which improves the interconnect reliability.

Preferably, in the method for fabricating a semiconductor device according to the present invention, the step of removing moisture includes the substep of desorbing, in a vacuum, water molecules adsorbed on the insulating film.

With this method, by producing a vacuum within a chamber used for removal of moisture, water molecules adsorbed onto the insulating film can be desorbed.

Preferably, the method for fabricating a semiconductor device according to the present invention further comprises, after the step of removing moisture, the step of applying an anticorrosive onto the surfaces of the interconnects.

With this method, moisture remaining around a portion of the insulating film exposed between the interconnects is removed, and then an anticorrosive is applied onto the surfaces of the interconnects. Therefore, a clean anticorrosive coating can be formed uniformly on the surfaces of the interconnects. This prevents corrosion of the copper interconnect and the occurrence of a break in the copper interconnect, thereby improving the interconnect reliability.

Preferably, the method for fabricating a semiconductor device according to the present invention further comprises, after the step of applying an anticorrosive, the step of removing, in a vacuum, moisture remaining around a portion of the insulating film exposed between the interconnects.

With this method, a trace amount of moisture remaining on the insulating film after application of an anticorrosive can be removed completely. Therefore, copper migration onto the insulating film can be completely hampered to entirely prevent a short circuit between the interconnects.

As described above, in the method for fabricating a semiconductor device according to the present invention, moisture remaining around a portion of the insulating film exposed between the interconnects is removed. Thereby, copper migration onto the insulating film caused by moisture remaining on the insulating film after the polishing can be hampered to prevent the occurrence of a short circuit between the interconnects. This improves the interconnect reliability. Moreover, an anticorrosive is applied after removal of moisture remaining around a portion of the insulating film exposed between the interconnects. Thereby, a clear anticorrosive coating can be formed uniformly on the surface of the interconnect. This prevents corrosion of the copper interconnect and the occurrence of a break in the copper interconnect, thereby improving the interconnect reliability.

DETAILED DESCRIPTION OF THE PREFERRED EMBODIMENTS

Hereinafter, embodiments of the present invention will be described with reference to the accompanying drawings.

First Embodiment

Figure 1:
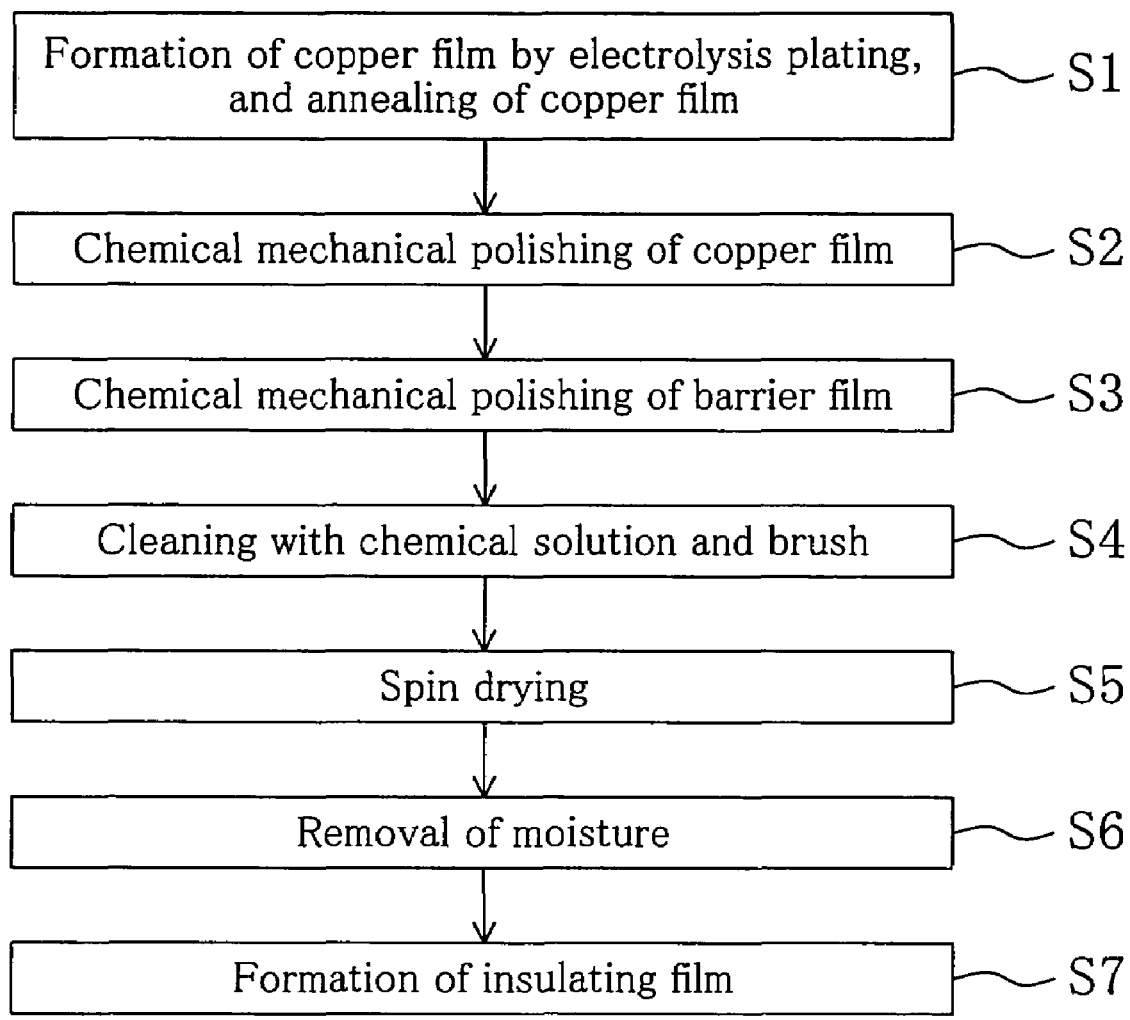
FIG. 1 is a flow chart showing a method for fabricating a semiconductor device according to a first embodiment of the present invention.
Figure 2:
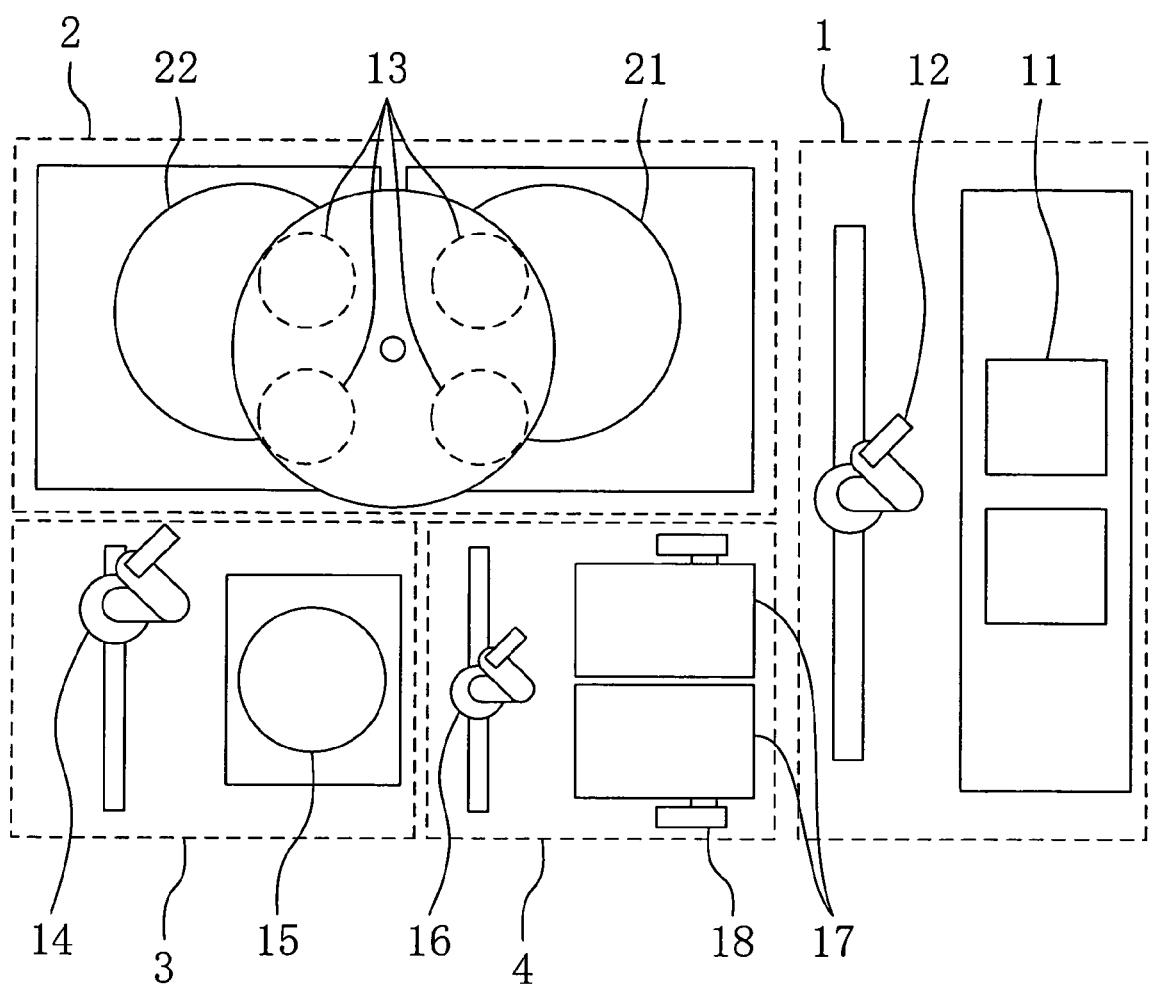
FIG. 2 is a view showing the structure of a semiconductor fabrication apparatus used for the method for fabricating a semiconductor device according to the first embodiment of the present invention.

A method for fabricating a semiconductor device according to a first embodiment of the present invention will be described with reference to the accompanying drawings. To be more specific, the method for fabricating a semiconductor device according to the first embodiment of the present invention will now be described along a flow chart in FIG. 1 showing the method for fabricating a semiconductor device according to the first embodiment of the present invention, and with reference to a view in FIG. 2 showing the schematic structure of a semiconductor fabrication apparatus used for the method for fabricating a semiconductor device according to the first embodiment of the present invention.

First description will be made of the step S1 shown in FIG. 1. By dry etching, an interconnect groove is formed in an interlayer insulating film on a semiconductor substrate not shown, and then, by sputtering, a barrier film and a copper seed film are formed in this order on the interlayer insulating film containing the interconnect groove. Subsequently, as shown in FIG. 1, by electrolysis plating, a copper film is formed on the semiconductor substrate to fill the interconnect groove, and then the formed copper film is subjected to annealing.

Next description will be made of the step S2 in FIG. 1 conducted after the step S1. By a dry robot 12 constituting a loading/unloading unit 1 shown in FIG. 2, the semiconductor substrate with the copper film deposited thereon in the step S1 is transported from a loading port 11 into a chemical mechanical polishing unit 2, and then mounted on a polishing head 13. Thereafter, the copper film formed on the semiconductor substrate mounted on the polishing head 13 is polished in a copper film polishing unit 21 until the barrier film underlying the copper film is exposed.

Next description will be made of the step S3 in FIG. 1 conducted after the step S2. After polishing of the copper film, the polishing head 13 with the semiconductor substrate mounted thereon moves to a barrier film polishing unit 22. Then, the barrier film on the semiconductor substrate is polished in the barrier film polishing unit 22 until the interlayer insulating film underlying the barrier film is exposed. Thereafter, a wet robot 14 constituting a cleaning unit 3 transports the resulting semiconductor substrate from the polishing head 13 into a cleaning bath 15 constituting the cleaning unit 3.

Next description will be made of the step S4 in FIG. 1 conducted after the step S3. In the cleaning bath 15 constituting the cleaning unit 3, particles such as abrasive and contaminants such as metal present on the semiconductor substrate are removed with a chemical solution and by brush cleaning.

Next description will be made of the step S5 in FIG. 1 conducted after the step S4. After the cleaning in the step S4, spin drying is performed. Note that in the conventional method, after the spin drying, the dry robot 12 transports the semiconductor substrate to the loading port 11.

On the other hand, in the method for fabricating a semiconductor device according to the present invention, the step S6 shown in FIG. 1 is conducted after the step S5. That is to say, after the spin drying in the cleaning unit 3, moisture remaining on the interlayer insulating film formed on the semiconductor substrate is removed in a moisture removal unit 4. To be more specific, by a robot 16 of the moisture removal unit, the semiconductor substrate having been subjected to spin drying in the step S5 is transported into any one of multiple vacuum chambers 17 provided in the moisture removal unit 4, and held on a semiconductor substrate supporting stage. The vacuum chamber 17 can attain a vacuum of $10^9$ Pa or lower by evacuation by a vacuum pump. Subsequently, the vacuum pump evacuates the vacuum chamber 17 to produce a vacuum in an atmosphere therewithin, whereby moisture (water molecules) adsorbed on the interlayer insulating film is desorbed and exhausted from the interlayer insulating film. Thereby, moisture existing around the surface of the interlayer insulating film is removed. To the vacuum chamber 17, a tool 18 for measuring the moisture concentration (moisture concentration measurement tool 18), such as a quadrupole mass spectrometer, is attached to measure the concentration of moisture within the vacuum chamber 17. When the moisture concentration thereof measured by the moisture concentration measurement tool 18 is equal to or lower than a predetermined concentration, for example, 1 ppm, the moisture removal process is terminated. Thereafter, the dry robot 12 unloads the semiconductor substrate to the loading port 11. In the manner described above, a series of process steps within the semiconductor fabrication apparatus shown in FIG. 2 has completed.

Next description will be made of the step S7 in FIG. 1 conducted after the step S6. After the moisture removal step in the step S6, an interlayer insulating film is formed on the interconnect, and then an interconnect is formed on the interlayer insulating film.

Hereinafter, with reference to FIG. 3, description will be made of whether or not the method for fabricating a semiconductor device according to the first embodiment of the present invention can improve the reliability of the interconnect.

First, whether or not the interconnect reliability is improved is evaluated by counting the number of chips having caused defects in the case where using a TEG exclusively for the evaluation of the interconnect reliability, the reliability test was conducted by operation at high temperatures for 36 hours under the condition of 125° C./2 V. Note that the number of chips to be evaluated is 576 per slice. On the TEGs exclusively for the reliability evaluation mentioned above, chemical mechanical polishing was performed. Thereafter, one TEG sample was subjected to a spin drying process as the conventional dry technique, while the other TEG sample was subjected to a moisture removal process in the present invention. Then, these two samples were compared for evaluation. Note that the period of time during which the samples were let to stand after the conventional drying process and the moisture removal process of the present invention, respectively, until the next process step was conducted was set at 24 hours.

The TEG exclusively for the evaluation of the interconnect reliability was let to stand for 24 hours after the moisture removal process in the present invention until the next process step was conducted. On the resulting TEG, tests by operation at high temperatures were implemented. The test result is shown in FIG. 3, which also shows the result of the same tests on the TEG subjected to the conventional spin drying process. In addition, FIG. 3 also shows the test result of the case where another TEG was subjected to the conventional spin drying technique and then it was let to stand for one hour until the next process step was conducted.

Figure 3:
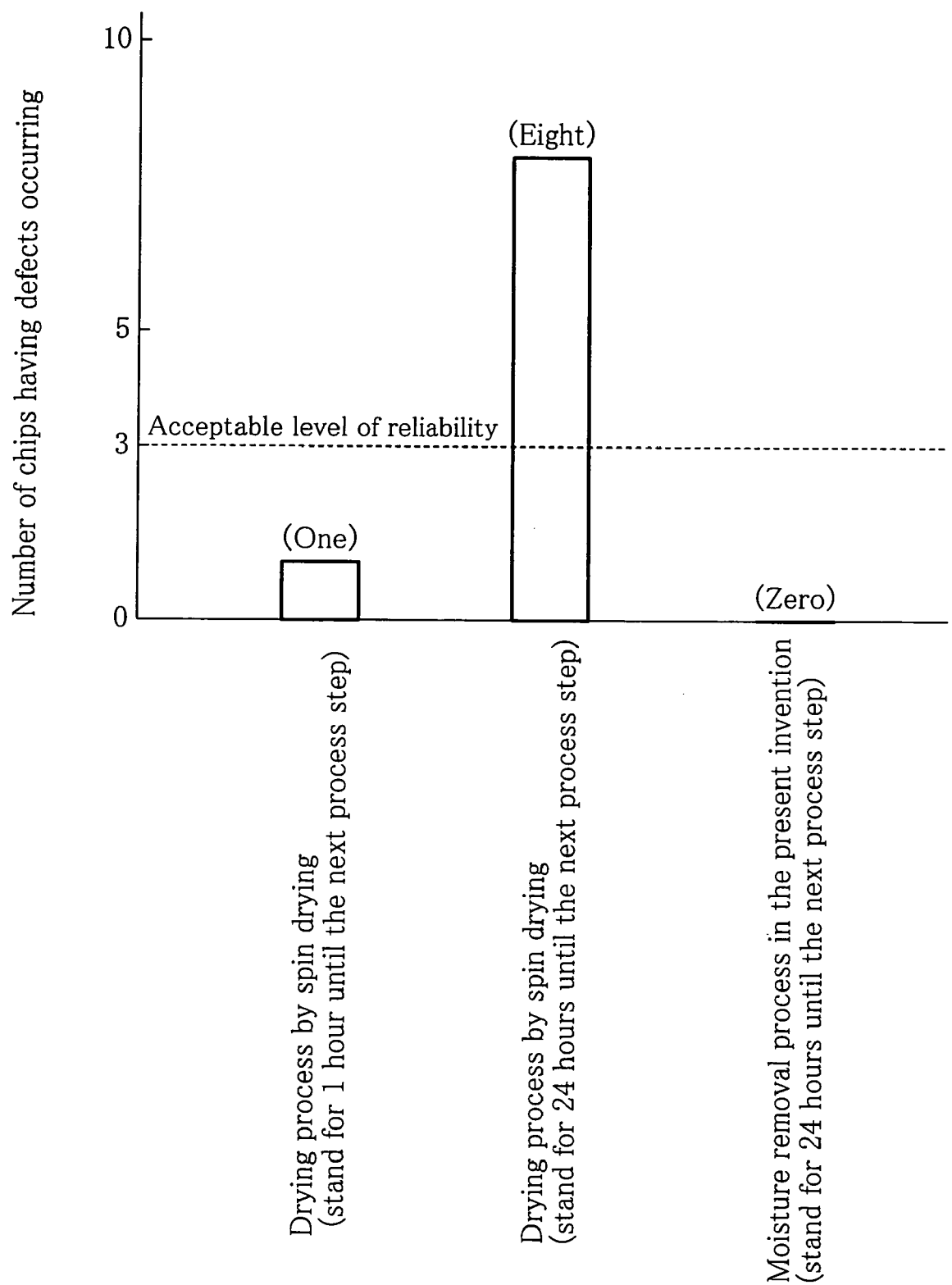
FIG. 3 is a graph showing the result of reliability evaluation for a copper interconnect in the case of employing the method for fabricating a semiconductor device according to the first embodiment of the present invention.

As shown in FIG. 3, in the case where the TEG was subjected to the conventional spin drying process and then it was let to stand for 24 hours until the next process step was conducted, the number of chips having caused defects was eight. On the other hand, in the case where the TEG was subjected to the moisture removal process in the present invention and then it was let to stand for 24 hours until the next process steps was conducted, the number of chips having caused defects was zero. Typically, the acceptable level of the reliability in this reliability evaluation is that the number of chips having caused defects is three or smaller. As is apparent from FIG. 3, the TEG subjected to the drying process with the spin drying technique did not satisfy the acceptable level of reliability, while the TEG subjected to the moisture removal process in the present invention satisfied that level. From this result, it is found that when the moisture removal process in the present invention was employed, the interconnect reliability was greatly improved. The reason why such a result has been obtained is as follows: after the chemical mechanical polishing in the steps S2 and S3 mentioned above, the moisture removal process in the present invention can remove moisture remaining on the interlayer insulating film formed on the semiconductor substrate. This hampers copper migration onto the interlayer insulating film caused by moisture remaining after the chemical mechanical polishing, thereby preventing the occurrence of a short circuit between the interconnects.

As described above, with the method for fabricating a semiconductor device according to the first embodiment of the present invention, moisture remaining on the interlayer insulating film on the semiconductor substrate can be removed after the chemical mechanical polishing. Therefore, the reliability of the copper interconnect can be improved.

Second Embodiment

Figure 4:
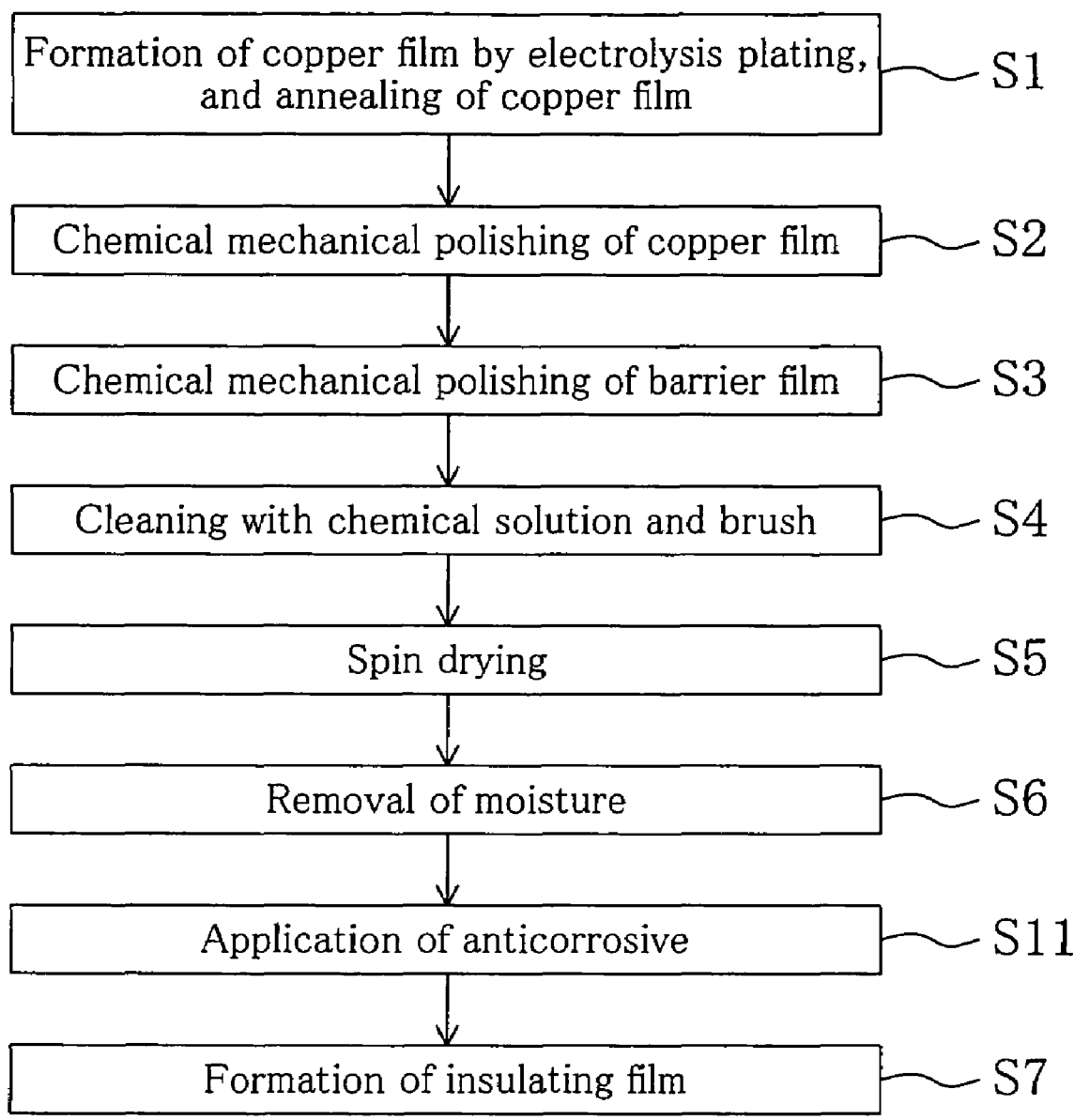
FIG. 4 is a flow chart showing a method for fabricating a semiconductor device according to a second embodiment of the present invention.
Figure 5:
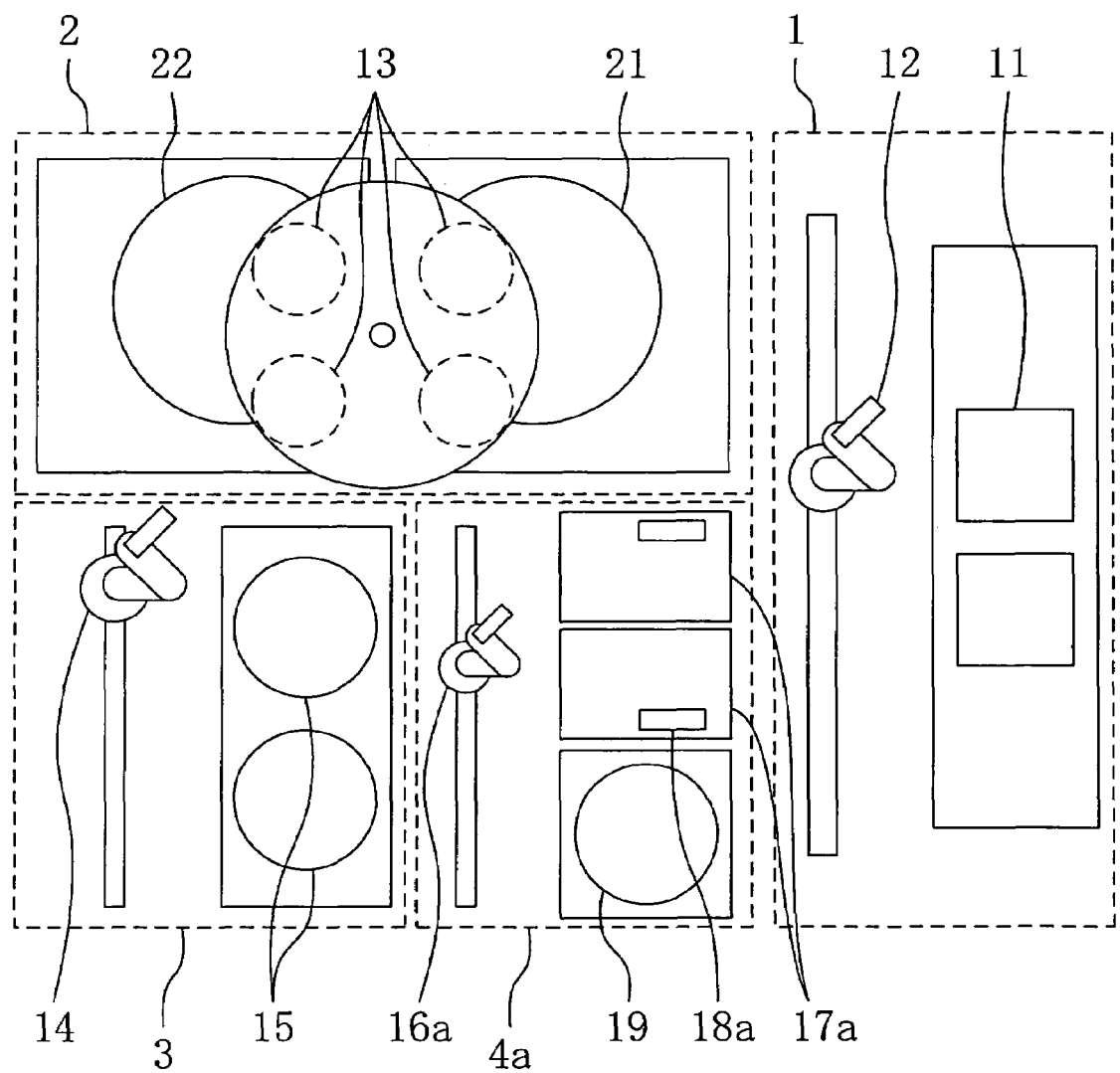
FIG. 5 is a view showing the structure of a semiconductor fabrication apparatus used for the method for fabricating a semiconductor device according to the second embodiment of the present invention.

A method for fabricating a semiconductor device according to a second embodiment of the present invention will be described with reference to the accompanying drawings. To be more specific, the method for fabricating a semiconductor device according to the second embodiment of the present invention will now be described along a flow chart in FIG. 4 showing the method for fabricating a semiconductor device according to the second embodiment of the present invention, and with reference to a view in FIG. 5 showing the schematic structure of a semiconductor fabrication apparatus used for the method for fabricating a semiconductor device according to the second embodiment of the present invention. The method for fabricating a semiconductor device according to the second embodiment of the present invention differs from the method for fabricating a semiconductor device according to the first embodiment of the present invention in that as shown in FIG. 4, the step S11 is added to the process flow in FIG. 1, but these methods are equal in the other points. Hence, the differences therebetween will be mainly described below. Further, associated with the differences, the semiconductor fabrication apparatus used for the method for fabricating a semiconductor device according to the second embodiment of the present invention includes an anticorrosive application unit 4a as shown in FIG. 5 instead of the moisture removal unit 4 constituting the semiconductor fabrication apparatus in FIG. 2 used for the method for fabricating a semiconductor device according to the first embodiment of the present invention. The anticorrosive application unit 4a has an anticorrosive application robot 16a, vacuum chambers 17a, and an anticorrosive application bath 19.

First, the steps S1 to S5 shown in FIG. 4 are carried out similarly to the above description of the first embodiment made using FIGS. 1 and 2. Note that in the conventional method, as mentioned in the first embodiment, the dry robot 12 transports the semiconductor substrate to the loading port 11 after the step S5.

On the other hand, in the method for fabricating a semiconductor device according to the second embodiment of the present invention, after the step S6 similar to the step in the first embodiment is conducted in which moisture remaining on the interlayer insulating film formed on the semiconductor substrate is removed, the step S11 of applying an anticorrosive onto the semiconductor substrate is conducted.

Herein, the step S6 shown in FIG. 4 will be described. That is to say, after spin drying (the step S5) in the cleaning unit 3, moisture remaining on the interlayer insulating film formed on the semiconductor substrate is removed in the anticorrosive application unit 4a. To be more specific, the semiconductor substrate subjected to spin drying in the step S5 is transported, by the anticorrosive application robot 16a, into any one of the multiple vacuum chambers 17a provided in the anticorrosive application unit 4a, and held on the semiconductor substrate supporting stage. The vacuum chamber 17a can attain a vacuum of $10^9$ Pa or lower by evacuation by a vacuum pump. Subsequently, the vacuum pump evacuates the vacuum chamber 17a to produce a vacuum in an atmosphere therewithin, whereby moisture (water molecules) adsorbed on the interlayer insulating film is desorbed and exhausted from the interlayer insulating film. Thereby, moisture existing around the surface of the interlayer insulating film is removed. To the vacuum chamber 17a, a tool 18a for measuring the moisture concentration (moisture concentration measurement tool 18a), such as a quadrupole mass spectrometer, is attached to measure the concentration of moisture within the vacuum chamber 17a. When the moisture concentration thereof measured by the moisture concentration measurement tool 18a is equal to or lower than a predetermined concentration, for example, 1 ppm, the moisture removal process is terminated. Thereafter, the anticorrosive application robot 16a transports the semiconductor substrate into the anticorrosive application bath 19.

Next description will be made of the step 11 shown in FIG. 4.

The anticorrosive application bath 19 includes, in its inside, a rotatable substrate holding system, a nozzle for supplying an anticorrosive onto the semiconductor substrate, and a nozzle for supplying pure water onto the semiconductor substrate. The nozzle for supplying an anticorrosive can move (oscillate) in the radial direction to the semiconductor substrate. While the semiconductor substrate transported into the anticorrosive application bath 19 and held by the substrate holding system is rotating at 500 rpm, the semiconductor substrate is supplied with an anticorrosive for 30 sec from the nozzle for supplying the anticorrosive. Thereby, an anticorrosive coating is formed on the copper film on the surface of the semiconductor substrate. In this step, as the anticorrosive, use is made of a solution containing 1% of BTA, and it is supplied onto the semiconductor substrate at 1 liter/min. The nozzle for supplying the anticorrosive performs a reciprocating motion in the radial direction to the semiconductor substrate at a rate of 2.5 cm/sec, whereby an anticorrosive coating with good uniformity over the substrate surface can be formed on the semiconductor substrate. Subsequently, pure water is supplied from the nozzle for supplying the pure water onto the semiconductor substrate to remove excess anticorrosive, and then the semiconductor substrate is rotated at 1500 rpm to perform spin drying. Thereafter, the dry robot 12 unloads the semiconductor substrate to the loading port 11. In the manner described above, a series of process steps within the semiconductor fabrication apparatus shown in FIG. 5 has completed.

Next description will be made of the step S7 in FIG. 4 conducted after the step S11. After the anticorrosive application process in the step S11, an interlayer insulating film is formed on the interconnect, and then an interconnect is formed on the interlayer insulating film.

Hereinafter, with reference to FIG. 6, description will be made of evaluation of the surface state of the interconnect formed in the case of employing the method for fabricating a semiconductor device according to the second embodiment of the present invention.

First, this evaluation is made using TEG wafers including a copper interconnect pattern of the copper interconnects having widths of 0.2 μm and 1.0 μm. Of the TEG wafers shown above, one TEG wafer was subjected to the anticorrosive treatment described in the conventional example, and the other TEG wafer was subjected to the anticorrosive treatment described in the second embodiment. After these processes, the wafers were let to stand in the air for three days, and the surface states of the resulting TEG wafers were compared for evaluation using an optical defect inspection tool.

Figure 6:
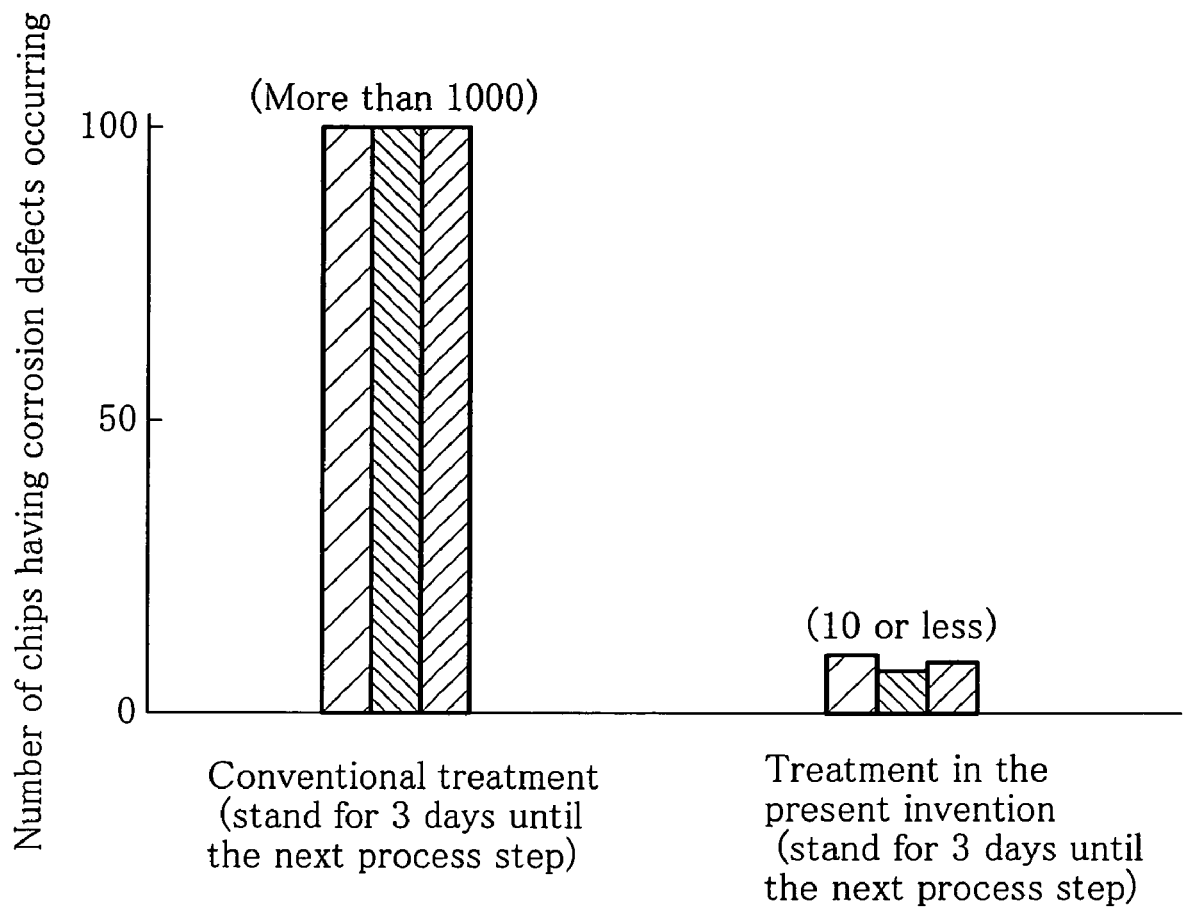
FIG. 6 is a graph showing the result of evaluation for defects resulting from corrosion of a copper interconnect in the case of employing the method for fabricating a semiconductor device according to the second embodiment of the present invention.
Figure 7A:
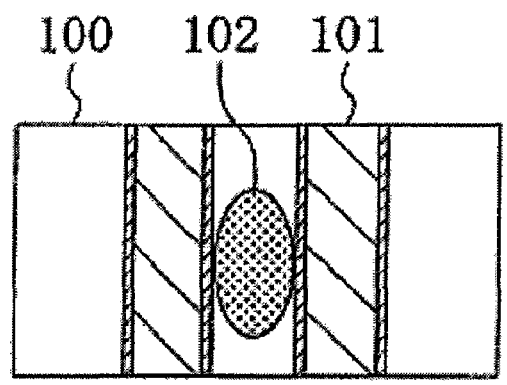
FIGS. 7A to 7D are plan views illustrating the mechanism of occurrence of failure in a copper interconnect.
Figure 7B:
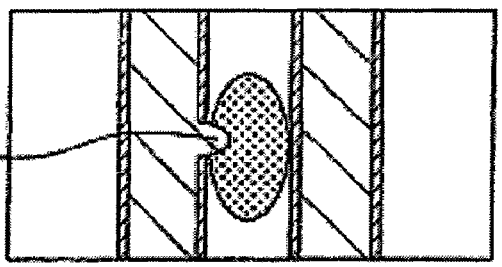
Figure 7C:
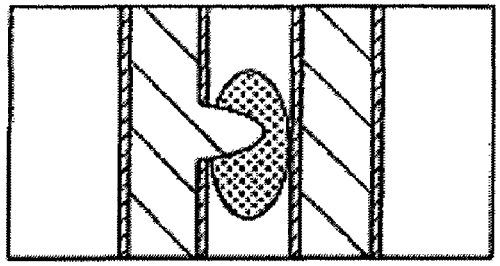
Figure 7D:
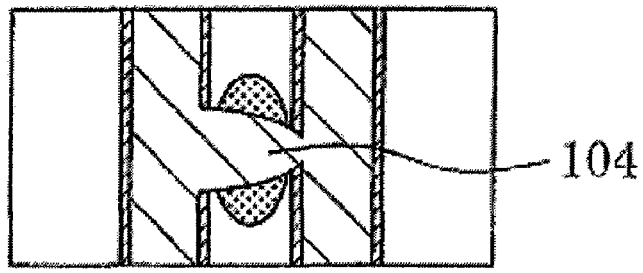
Figure 8A:
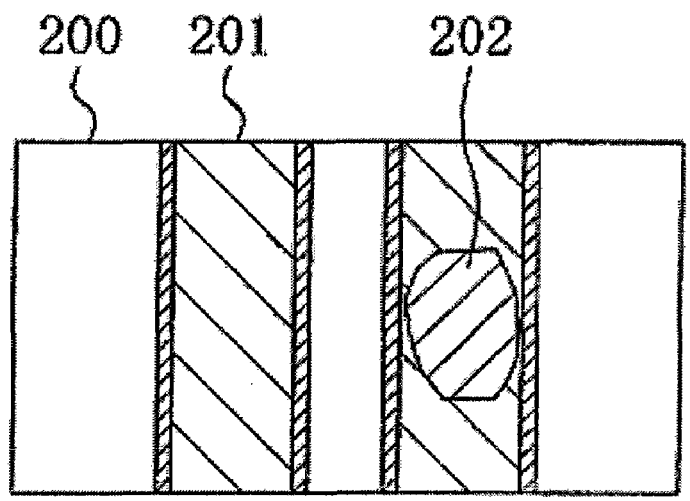
FIGS. 8A and 8B are plan and sectional views, respectively, for illustrating corrosion defects in the copper interconnect.
Figure 8B:
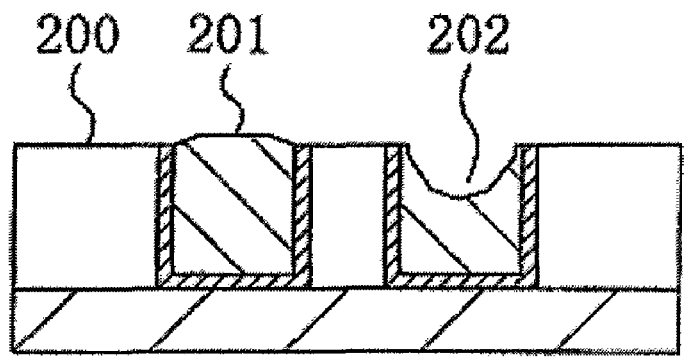

As is apparent from FIG. 6, in the case of the treatment of the conventional example, more than a thousand defects resulting from corrosion of the copper interconnect occurred, while in the case of the treatment of the second embodiment, only ten or less defects resulting from corrosion of the copper interconnect occurred. The reason why such a result was obtained is as follows. The treatment of the second embodiment removes moisture remaining on the semiconductor substrate after the chemical mechanical polishing in the steps S2 and S3 shown above, and then the anticorrosive coating is formed. Thereby, a uniform anticorrosive coating can be formed on the surface of the copper interconnect, which in turn prevents development of corrosion on the surface of the copper interconnect even though the semiconductor substrate is let to stand in the air for a long time.

As described above, in the method for fabricating a semiconductor device according to the second embodiment of the present invention, moisture remaining on the interlayer insulating film formed on the semiconductor substrate is removed after chemical mechanical polishing, and then the anticorrosive coating is formed. Therefore, similarly to the first embodiment, removal of moisture can hamper the occurrence of a short circuit between the interconnects, and in addition the anticorrosive coating can be formed uniformly on the copper interconnect. This prevents the occurrence of defects resulting from corrosion of the copper interconnect and a break in the copper interconnect, thereby further improving the reliability of the copper interconnect.

After the step S11 in FIG. 4 of applying an anticorrosive is conducted, the step can also be carried out again in which the semiconductor substrate is transported into the vacuum chamber 17a shown in FIG. 5 and moisture remaining on the interlayer insulating film formed on the semiconductor substrate is removed. By such a procedure, a trace amount of moisture remaining on the interlayer insulating film formed on the semiconductor substrate can be completely removed after the step S11 of applying an anticorrosive. Thus, not only the anticorrosive coating can be formed uniformly on the semiconductor substrate, but also copper migration onto the interlayer insulating film can be prevented. As a result, a break in the interconnect and short circuit failure between the interconnects can be prevented, thereby greatly improving the interconnect reliability.

The method for fabricating a semiconductor device according to the present invention can improve the reliability of the copper interconnect, so that it is useful in fabrication of a high-performance semiconductor device with multilayer interconnects.

What is claimed is:

1. A method for fabricating a semiconductor device, comprising the steps of:

(a) forming interconnect grooves in an insulating film on a substrate;

(b) forming a copper film on the insulating film to fill the interconnect grooves;
(c) polishing portions of the copper film existing outside the interconnect grooves to form interconnects;
(d) performing a cleaning process on the substrate having been formed with the interconnects;
(e) removing, after the cleaning process, moisture remaining around a portion of the insulating film exposed between the interconnects; and
(f) coating an anticorrosive onto the surfaces of the interconnects after step (e),
wherein step (e) includes a substep of desorbing, in a vacuum, water molecules adsorbed on the insulating film, and
the anticorrosive is not exposed to step (e).

2. The method of claim 1, further comprising, after step (f), the step of removing, in a vacuum, moisture remaining around a portion of the insulating film exposed between the interconnects.

3. The method of claim 1, wherein steps (c), (d), (e) including the substep, and (f) are carried out within a single semiconductor fabrication apparatus.

4. The method of claim 1, wherein step (e) further includes a substep of performing, after the cleaning process, spin drying on the substrate.

5. A method for fabricating a semiconductor device, comprising the steps of:

(a) forming interconnect grooves in an insulating film on a substrate;
(b) forming a copper film on the insulating film to fill the interconnect grooves;
(c) polishing portions of the copper film existing outside the interconnect grooves to form interconnects;
(d) performing a cleaning process on the substrate having been formed with the interconnects;
(e) removing, after the cleaning process, moisture remaining around a portion of the insulating film exposed between the interconnects; and
(f) coating an anticorrosive onto the surfaces of the interconnects after step (e),
wherein step (e) further includes a substep of performing, after the cleaning process, spin drying on the substrate, and after performing the spin drying, a substep of desorbing, in a vacuum, water molecules adsorbed on the insulating film.

6. The method of claim 1, further comprising the step of measuring a moisture concentration and terminating step (e) when the moisture concentration is equal to or lower than a predetermined concentration.

7. The method of claim 5, further comprising the step of measuring a moisture concentration and terminating step (e) when the moisture concentration is equal to or lower than a predetermined concentration.

* * * * *